United States Patent
Brilka

(10) Patent No.: US 7,570,110 B2
(45) Date of Patent: Aug. 4, 2009

(54) ARRANGEMENT FOR DEMODULATING A VESTIGAL SIDEBAND SIGNAL

(75) Inventor: Joachim Brilka, Hamburg (DE)

(73) Assignee: NXP B.V., Eindhoven (NL)

( * ) Notice: Subject to any disclaimer, the term of this patent is extended or adjusted under 35 U.S.C. 154(b) by 54 days.

(21) Appl. No.: 11/911,864

(22) PCT Filed: Apr. 13, 2006

(86) PCT No.: PCT/IB2006/051158

§ 371 (c)(1),
(2), (4) Date: Oct. 18, 2007

(87) PCT Pub. No.: WO2006/111901

PCT Pub. Date: Oct. 26, 2006

(65) Prior Publication Data

US 2008/0191799 A1 Aug. 14, 2008

(30) Foreign Application Priority Data

Apr. 19, 2005 (EP) .................................. 05103135

(51) Int. Cl.
*H03D 1/24* (2006.01)
(52) U.S. Cl. ........................ 329/357; 329/360; 329/363
(58) Field of Classification Search ................ 329/347, 329/357, 358, 360, 363, 366
See application file for complete search history.

(56) References Cited

U.S. PATENT DOCUMENTS

| | | | |
|---|---|---|---|
| 5,122,879 A | 6/1992 | Ito | |
| 5,881,107 A * | 3/1999 | Termerinac et al. | ......... 375/279 |
| 6,714,776 B1 | 3/2004 | Birleson | |
| 2004/0021797 A1 | 2/2004 | Onoue et al. | |
| 2004/0130483 A1 | 7/2004 | Brilka et al. | |

FOREIGN PATENT DOCUMENTS

| | | |
|---|---|---|
| DE | 10122830 A1 | 10/2007 |
| GB | 2332578 A | 10/2007 |

\* cited by examiner

*Primary Examiner*—David Mis

(57) ABSTRACT

An arrangement is described for demodulating a vestigial sideband signal component contained in an amplitude-modulated frequency signal, and preferably in a vision intermediate-frequency signal derived from a television signal. What distinguishes the invention is that there are provided two parallel, preferably identical, mixing stages (8a, 8b) that operate at a phase shift of substantially, and preferably exactly, 90°, of which mixing stages a first one (8a) produces from the frequency signal a first output signal and a second one (8b) produces from the frequency signal a second output signal that is phase shifted by substantially, and preferably exactly, 90° relative to the first output signal, a downstream phase-shifter (12) that causes a phase shift between the first and second output signals from the mixing stages (8a, 8b) of substantially, and preferably exactly, a further 90°, an adder (14) that adds together the output signals from the phase shifter (12), which output signals have been phase shifted relative to one another by substantially, and preferably exactly, 180°, a local oscillator (10) that drives the mixing stages with a phase shift of substantially, and preferably exactly, 90°, and a setting device for setting the frequency and phase of the local oscillator (10), the setting device setting the frequency and phase of the local oscillator (10) substantially, and preferably exactly, to the frequency and phase of the frequency signal.

12 Claims, 2 Drawing Sheets

ARRANGEMENT FOR DEMODULATING A VESTIGAL SIDEBAND SIGNAL

Figure 1:
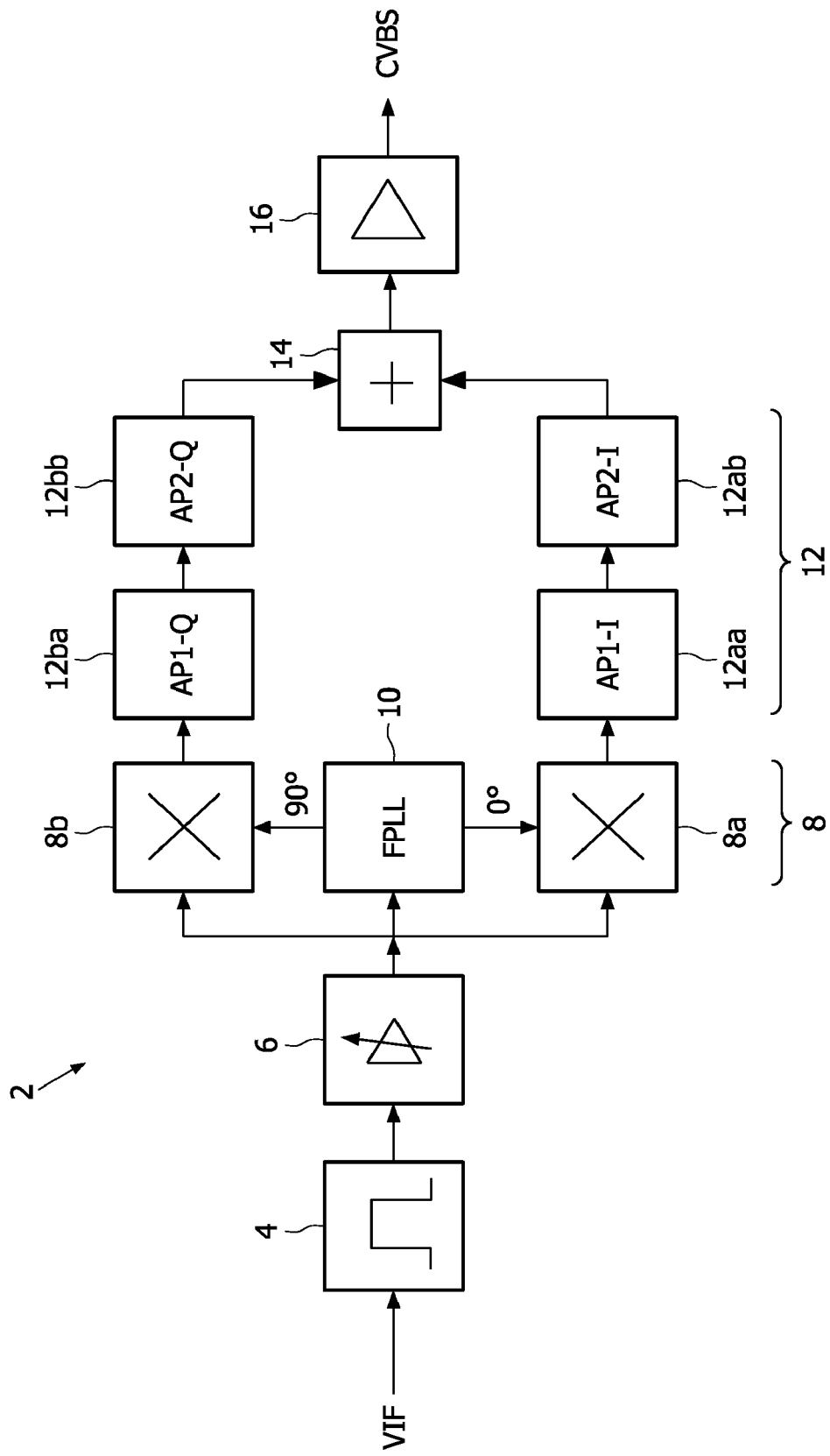

The present invention relates to an arrangement for demodulating a vestigial sideband signal component contained in an amplitude-modulated frequency signal, preferably in a vision intermediate-frequency signal derived from a television signal.

A demodulating arrangement of this kind is used in particular in analog and digital television systems, and it is used there chiefly for demodulating VSB-modulated television signals in high-frequency (HF) and intermediate-frequency (IF) stages of a receiver front end, such as in, for example, a television receiver, a set-top box or a video card fitted in a personal computer.

Analog television signal broadcasts employing vestigial sideband modulation can only be processed and demodulated by very specific signal stages and filters, whereas DVB (digital video broadcast) broadcasts employing OFDM modulation call for entirely different signal processing due to the mixing, filtering and analog-to-digital conversion that is required in this case.

Particularly for the applications mentioned, the demodulating circuits that have been used hitherto are of rather complicated construction, due in particular to the use of Nyquist filter stages to produce a Nyquist edge in the vestigial sideband television signal (in analog systems) and to the use of window filter stages (in digital systems), which filter stages are usually formed in systems of either type by surface acoustic wave (SAW) filters. A further difficulty with the construction of previous demodulating circuits has been to provide them, in both analog and digital video broadcast systems, for all the current standards.

It is therefore an object of the present invention to improve a demodulating arrangement of the kind specified in the opening paragraph in such a way that it enables correct demodulation to be performed of a vestigial sideband signal in an amplitude-modulated frequency signal without the use of Nyquist filter stages.

It is also an object of the present invention to propose a circuit design that is simplified in comparison with previous applications and that can also be implemented, if required, in a substantially fully integrated circuit at no great cost or effort.

These objects are achieved by an arrangement for demodulating a vestigial sideband signal component contained in an amplitude-modulated frequency signal, preferably in a vision intermediate-frequency signal derived from a television signal, characterized by two parallel, preferably identical, mixing stages that operate at a phase shift of substantially, and preferably exactly, 90°, of which mixing stages a first one produces from the frequency signal a first output signal and a second one produces from the frequency signal a second output signal that is phase shifted by substantially, and preferably exactly, 90° relative to the first output signal, a downstream phase-shifter that causes a phase shift between the first and second output signals from the mixing stages of substantially, and preferably exactly, a further 90°, an adder that adds together the output signals from the phase shifter, which output signals have been phase shifted relative to one another by substantially, and preferably exactly, 180°, a local oscillator that drives the mixing stages with a phase shift of substantially, and preferably exactly, 90°, and a setting device for setting the frequency and phase of the local oscillator, the setting device setting the frequency and phase of the local oscillator substantially, and preferably exactly, to the frequency and phase of the frequency signal.

Hence, the frequency signal is fed into two preferably identical mixing stages that are connected in parallel and that differ only in that the drive to them from the local oscillator is phase-shifted by 90°. It is particularly important in this case that the setting device sets the frequency and phase of the local oscillator substantially, and preferably exactly, to the frequency and phase of the frequency signal that is fed in, so that the frequency and phase of the local oscillator are substantially or exactly equal to the frequency and phase of the frequency signal. The output signals from the two mixing stages that are produced in this way are subjected, in a downstream phase-shifter, to a phase shift of a further 90°, and the output signals from the phase shifter, which have been phase shifted by 180° relative to one another in this way, are added together again in an adder. As a result of the addition and as a function of the polarity of the second output signal relative to the first output signal, a correctly demodulated vestigial sideband signal component for one vestigial sideband is obtained from the frequency signal while the vestigial sideband signal component for the other vestigial sideband is suppressed. It should be noted at this point that what is of importance is not the absolute phase shift but only the relative phase shift. In cases where use is made of a vision intermediate-frequency signal derived from a television signal, it is then the CVBS (color video blanking sync) signal that is obtained at the output of the adder.

The demodulation arrangement according to the invention therefore has the effect of a synchronous demodulator for producing a Nyquist edge in the vestigial sideband signal component, a zero point being produced in one of the two output signals from the mixing stages, and preferably in the second output signal from the second mixing stage, for the purpose of suppressing low-frequency signal components that, in cases where a vision intermediate-frequency signal derived from a television signal was being processed, might otherwise result in undesirable flicker of the picture and video noise, caused by phase noise in the local oscillator. With the help of the invention, it is thus possible for the effect of Nyquist filtering to be obtained without the use of complicated and expensive surface acoustic wave filter stages. In addition, the invention also makes it possible for disruptive adjacent channels to be suppressed. Finally, the demodulating arrangement according to the invention can be used, with no major cost or effort, for different television standards in both the analog and digital fields.

The invention also provides a circuit design that can be implemented, at no major cost or effort, in a substantially fully integrated circuit. This is because, by means of the invention, the circuit design is, overall, considerably simplified in comparison with conventional demodulating arrangements because, in particular, the demodulating arrangement according to the invention does without any costly surface acoustic wave Nyquist filter stages. The demodulating arrangement according to the invention can thus advantageously be incorporated in, for example, a hybrid receiver for analog and digital television broadcasts.

It is true that DE 101 22 830 A1, and the corresponding US 2004/0130483 A1, disclose a similar circuit design; however the circuit design disclosed in that case is intended solely for the free-running downward mixing of digitally modulated intermediate-frequency television signals with downstream filtering for sideband suppression, as a result of which what is performed by this known design of circuit is a frequency conversion. For this purpose, the frequency of the local oscillator is kept freely settable, to enable a match to be made to intermediate frequencies used in different television standards, and it is advantageously so selected that signal components of a high level that are adjacent to the useful band are reduced to a frequency of zero, those local oscillator frequencies being made selectable which, for the different word-wide standards, are preferably 250 kHz above a possible analog adjacent picture carrier and are thus below the useful signal in terms of frequency. The present invention on the other hand does not relate to free-running downward mixing but to the demodulation of a vestigial sideband signal component contained in an amplitude-modulated frequency signal, it having been found in accordance with the invention that correct demodulation can be achieved, without the use of costly surface acoustic wave filter stages, by locking the frequency and phase of the local oscillator substantially, and preferably exactly, to the frequency and phase of the frequency signal. Hence, in contrast to the prior art, the frequency of the local oscillator is not freely selectable in the case of the invention, nor, for the reasons explained above, can it be, and it is also situated in an entirely different range, something that is equally true of the phase of the local oscillator, a factor that is obviously not of any significance in the prior art. The entirely different type of use, namely as a demodulating arrangement, and the setting, in accordance with the invention, of the phase and frequency of the local oscillator, are not however apparent from the prior art mentioned, and the invention is thus not made obvious by this prior art.

The setting means usefully has a phase-locked loop circuit that has to be locked substantially, and preferably exactly, to the phase of the frequency signal.

As an option, there may in addition be provided an inverter for inverting the polarity of the output signal from one of the two mixing stages, and preferably from the second mixing stage, by which means a facility is provided for selecting a given one of the two vestigial sideband signal components as a function of the standard that is to be used for the intended demodulation.

The phase shifter is preferably formed by a complex filtering means.

In a particularly preferred embodiment of the invention, the phase shifter has a first phase-shifting path for processing the output signal from the first mixing stage and a second phase-shifting path for processing the output signal from the second mixing stage, as a result of which the mixing stages and the phase shifter together form two parallel signal channels. Each phase-shifting path usefully has at least one all-pass filter.

To allow the frequency signal to be set to a desired level, the mixing stages may have an adjustable amplifier connected upstream of them.

For possible pre-filtering of the frequency signal for the advance suppression of unwanted signal components, the mixing stages may also have a window-filter connected upstream of them, in which case the window-filter should preferably be connected upstream of the amplifier. Particularly to allow the demodulating arrangement according to the invention to be applied to different television standards, the cost and complication in terms of filters can be appreciably reduced by the shared use in both the analog and the digital fields of one window-filter.

A preferred field of application of the invention is the processing of a vision intermediate-frequency signal derived from a television signal, within a frequency signal of up to approximately 60 MHz.

These and other aspects of the invention are apparent from and will be elucidated with reference to the embodiments described hereinafter.

Figure 2:
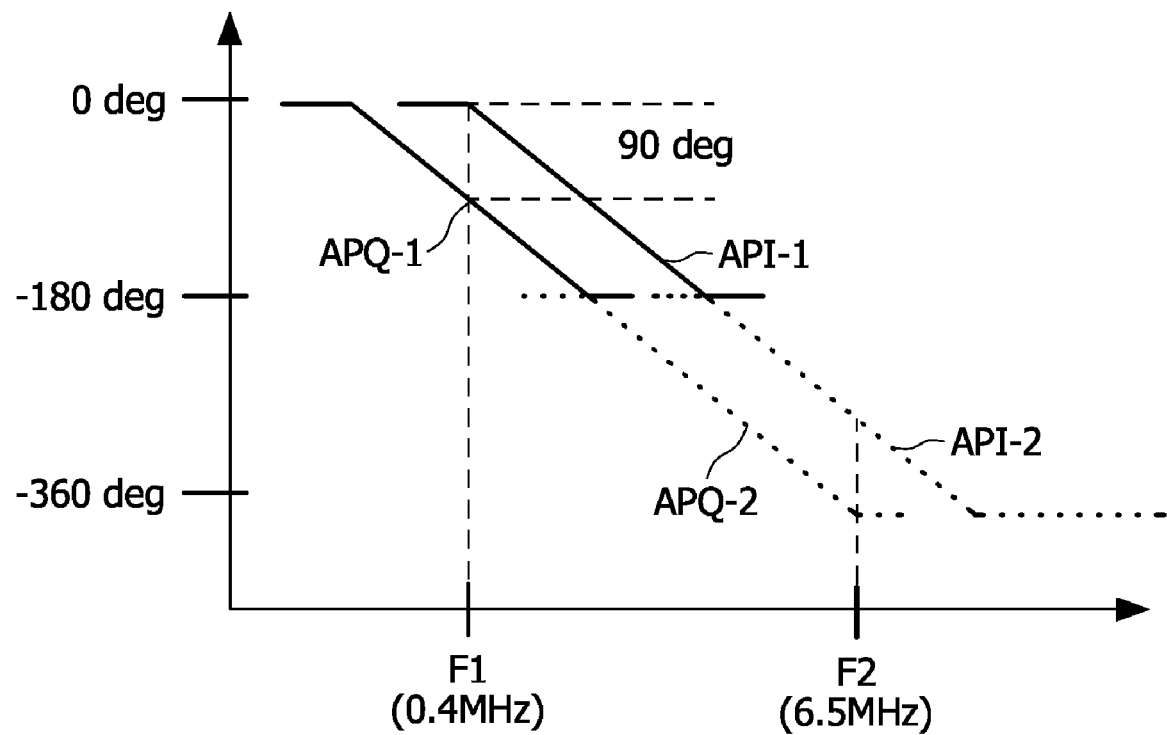

In the drawings:

FIG. 1 is a schematic block circuit diagram of a demodulating circuit according to a preferred embodiment of the invention; and FIG. 2 is a graph to show the effect of the circuit of FIG. 1.

FIG. 1 is a schematic block circuit diagram of a demodulating circuit 2 in which is demodulated a vestigial sideband signal component that, in the embodiment shown, is contained in a VIF (vision intermediate-frequency) signal derived from a television signal. The vision intermediate-frequency signal is produced from a high-frequency signal in a tuner (not shown in the Figures) that is connected upstream of the demodulating circuit 2.

As can be seen from FIG. 1, the demodulating circuit 2 has, in the embodiment shown, a window filter 4 through which the vision intermediate-frequency signal is first passed to filter out any disruptive signal components, or ones that are not required, situated above and below the frequency band that is of interest in the present case. Connected downstream of the window filter 4 is an adjustable amplifier 6 in which the vision intermediate-frequency signal can be set to a standardized level. The signal that has been standardized and leveled in this way is then fed into a mixer 8 to which a local oscillator 10 is connected.

As can also be seen from FIG. 1, the mixer 8 comprises two identical stages 8a, 8b that differ only in that the drive to them from the local oscillator 10 is 90° out of phase. For this purpose, the local oscillator 10 supplies two exactly orthogonal control signals that are designated "in-phase" and "in-quadrature". Hence, what are fed to an in-phase path formed by the first mixing stage 8a are the vision intermediate-frequency signal on the one hand and the in-phase control signal from the local oscillator 10 on the other hand, and what are fed to an in-quadrature path formed by the second mixing stage 8b are the vision intermediate-frequency signal on the one hand and the in-quadrature control signal from the local oscillator 10 on the other hand.

In the embodiment shown, the local oscillator 10, which is preferably a voltage controlled oscillator (VCO), has a phase-locked loop (PLL) circuit (not shown in detail in FIG. 1) that is used for setting the frequency and phase of the local oscillator 10. The frequency and phase of the local oscillator 10 are locked to the frequency and phase of the vision intermediate-frequency signal in this case and, this being the case, are therefore not freely selectable and settable.

As a result, the first mixing stage 8a supplies a first output signal, also referred to as the in-phase signal, and the second mixing stage 8b supplies a second output signal, also referred to as the in-quadrature signal, these two output signals being phase shifted relative to one another by 90°.

In addition, polarity, preferably that of the second output signal, can be inverted by the second mixing stage 8b, as a result of which the vestigial sideband signal component that is to be demodulated can be selected as a function of, in particular, the standard that is to be used. For this purpose, the signal concerned for example can be inverted in the appropriate way by the local oscillator 10, which is in fact used to control the associated mixing stage 8a or 8b. There are however also other possible ways that are conceivable of inverting the polarity of one of the two output signals from the mixer 8.

The output signals from the mixer 8 are fed to a phase-shifter 12 that preferably operates by a complex filter process. As can be seen from FIG. 1, the phase-shifter 12 has, in the embodiment shown, a first phase-shifter path that is connected to the first mixing stage 8a and a second phase-shifter path that is connected to the second mixing stage 8b, each phase-shifter path comprising, in the embodiment shown, two all-pass filters, which are AP1-I 12aa and AP2-I 12ab, and AP1-Q 12ba and AP1-Q 12bb, in the respective cases and which are connected one behind the other. The all-pass filters are preferably passive components between which buffer amplifiers may be inserted.

The phase-shifter 12 is so designed that a very linear dphi/df ratio is obtained over a typical frequency range of approximately 0.4 to 6.5 MHz. Also, the phase-shifter is set in such a way as to exactly produce, over said frequency range, a constant phase difference of 90° between the two output signals from the mixing stage 8, the phase shift of the in-quadrature path (the upper path in FIG. 1) being, in the embodiment shown, 90° greater than the phase shift of the in-phase path (the lower path in FIG. 1). In this way a phase shift of a further 90° is caused between the two output signals from the mixer 8. It should also be pointed out in this connection that what is of importance here is not the absolute, but the relative phase shift.

Because a phase shift of a further 90° is thus produced between the in-phase path and the in-quadrature path by the phase shifter 12 throughout the entire frequency range that is relevant, what is obtained overall is a phase difference of 0° between the in-phase path and the in-quadrature path for one vestigial sideband signal component, and a phase difference of 180° between them for the other vestigial sideband signal component. The two output signals from the phase shifter 12 are then fed to an adder 14 that adds the two signals together. By the addition, there is obtained from the vision intermediate-frequency signal a correctly demodulated vestigial sideband signal component for one vestigial sideband, while the vestigial sideband signal component for the other vestigial sideband is suppressed, which happens as a function of the polarity of the one output signal relative to the other output signal. The output signal from the adder 14 is then passed, in the embodiment shown in FIG. 1, through a group transit-time delay equalizer 16 to the output of the demodulating circuit 2, at which the output signal appears as a CVBS signal.

The phase shift on the in-quadrature path is preferably selected to be 90° greater than the phase shift on the in-phase path, due to the fact that the signal occurs on the in-quadrature path only for single-sideband frequencies. Consequently, the group transit-time delay should be kept as small as possible. Because of this phenomenon, the signal on the in-quadrature path should also be passed through a high-pass filter (not shown in FIG. 1) for suppressing low-frequency video noise that occurs due to phase noise in the local oscillator 10, which in turn is caused by the phase-sensitivity of the demodulation on the in-quadrature path.

The effect of the demodulating circuit 2 described above is shown by way of example in the graph in FIG. 2. Reference should also be made to the Table shown below to supplement the graph.

| VIF band | First output signal from the first mixing stage 8a | Second output signal from the second mixing stage 8b | Phase shift between the in-quadrature path and the in-phase path at the output of the phase shifter 12 | Output signal from the adder 14 |
|---|---|---|---|---|
| Double sideband | Amp = 1<br>φ = 0° | Amp = 0 | — | Amp = 1 |
| Lower single sideband | Amp = 0.5<br>φ = 0° | Amp = 0.5<br>φ = +90° | φ = 0° | Amp = 1 |
| Upper single sideband | Amp = 0.5<br>φ = 0° | Amp = 0.5<br>φ = −90° | φ = −180° | Amp = 0 |

Amp: standardized amplitude (max. = 1)
φ: phase shift

The invention claimed is:

1. An arrangement for demodulating a vestigial sideband signal component contained in an amplitude-modulated frequency signal, the demodulating arrangement comprising:
   a local oscillator;
   two parallel mixing stages to receive the frequency signal, wherein the two parallel mixing stages are driven by the local oscillator to operate at a phase shift of substantially 90°, of which mixing stages a first one produces from the frequency signal a first output signal and a second one produces from the frequency signal a second output signal that is phase shifted by substantially 90° relative to the first output signal;
   a downstream phase-shifter that causes a further phase shift between the first and second output signals from the mixing stages of substantially, a further 90° for a total phase difference of about 180° between the first output signal and the second output signal;
   an adder that adds together the output signals from the phase-shifter; and
   a setting device to receive the frequency signal prior to mixing of the frequency signal by the parallel mixing stages for setting the frequency and phase of the local oscillator substantially to the frequency and phase of the frequency signal.

2. A demodulating arrangement as claimed in claim 1, wherein the setting device comprises a phase-locked loop circuit that is locked substantially to the phase of the frequency signal.

3. A demodulating arrangement as claimed in claim 1, wherein the second mixing stage comprises an inverter for inverting the polarity of the second output signal.

4. A demodulating arrangement as claimed in claim 1, wherein the phase-shifter is formed by a complex filter.

5. A demodulating arrangement as claimed in claim 1, wherein the phase-shifter comprises a first phase-shifting path for processing the first output signal from the first mixing stage and a second phase-shifting path for processing the second output signal from the second mixing stage.

6. A demodulating arrangement as claimed in claim 5, wherein each phase-shifting path comprises at least one all-pass filter.

7. A demodulating arrangement as claimed in claim 1, further comprising an adjustable amplifier connected upstream of the mixing stages to allow the frequency signal to be set to a desired level.

8. A demodulating arrangement as claimed in claim 1, further comprising a window-filter connected upstream of the mixing stages.

9. A demodulating arrangement as claimed in claim 7, wherein the window-filter is connected upstream of the amplifier.

10. A demodulating arrangement as claimed in claim 1 for processing a vision intermediate-frequency signal derived from a television signal, within a frequency range of up to approximately 60 MHz.

11. A demodulating arrangement as claimed in claim 1, wherein the downstream phase-shifter causes a phase difference of substantially 0° between an in-phase path and an in-quadrature path for one vestigial sideband signal component of the frequency signal, and causes a phase difference of substantially 180° between an in-phase path and an in-quadrature path for another vestigial sideband signal component of the frequency signal.

12. A demodulating arrangement as claimed in claim 7, wherein an input of the setting device is coupled to an output of the adjustable amplifier to directly receive the frequency signal from the adjustable amplifier connected upstream of the mixing stages.

* * * * *